United States Patent [19]
Yoshinaga et al.

[11] Patent Number: 5,623,236
[45] Date of Patent: Apr. 22, 1997

[54] CHIP-TYPE PIEZOELECTRIC-RESONATOR AND METHOD OF MANUFACTURING THE SAME

[75] Inventors: Takashi Yoshinaga; Motohide Yonemura, both of Kyoto, Japan

[73] Assignee: Murata Manufacturing Co., Ltd., Japan

[21] Appl. No.: 590,039

[22] Filed: Jan. 25, 1996

Related U.S. Application Data

[63] Continuation of Ser. No. 375,255, Jan. 19, 1995, abandoned, which is a continuation of Ser. No. 138,358, Oct. 18, 1993, abandoned.

[30] Foreign Application Priority Data

Oct. 19, 1992 [JP] Japan ................................. 4-280008

[51] Int. Cl.⁶ .................................................. H03H 9/00
[52] U.S. Cl. ........................... 333/187; 310/340; 310/344; 29/25.35
[58] Field of Search .................................. 333/187–192; 310/344, 348; 29/25.35

[56] References Cited

U.S. PATENT DOCUMENTS 5,192,925  3/1993  Kaida ........................ 333/192
5,304,980  4/1994  Yoshinaga et al. ............ 333/187
5,357,662  10/1994  Takagi et al. ................. 29/25.35

FOREIGN PATENT DOCUMENTS 0299310  12/1990  Japan ................................. 333/187 R
0175713  7/1991  Japan ................................. 333/187 R
3265207  11/1991  Japan ................................. 333/187
0529864  2/1993  Japan ................................. 333/188

Primary Examiner—Benny Lee
Assistant Examiner—Darius Gambino
Attorney, Agent, or Firm—Ostrolenk, Faber, Gerb & Soffen, LLP

[57] ABSTRACT

In order to regularly properly define cavities for vibrating spaces in a chip-type piezoelectric-resonator which is protected with resin to be capable of surface mounting, a mother substrate comprising a piezoelectric substrate, a plurality of piezoelectric resonance elements formed thereon is prepared and bank-shaped adhesive layers are formed on respective major surfaces of the mother substrate to enclose the vibrating region, and mother sheets provided with plural cover sheets are arranged to cover both major surfaces of the mother substrate, thereby defining cavities for vibrating spaces. Then, protective resin members are applied to cover both major surfaces of the mother substrate, which in turn is divided to obtain a plurality of chip-type piezoelectric-resonators.

17 Claims, 8 Drawing Sheets

5,623,236

CHIP-TYPE PIEZOELECTRIC-RESONATOR AND METHOD OF MANUFACTURING THE SAME

This is a Continuation of application Ser. No. 08/375,255, filed on Jan. 19, 1995, now abandoned, which is a continuation of application Ser. No. 08/138,358, filed on Oct. 18, 1993, now abandoned.

BACKGROUND OF THE INVENTION

1. Field of the Invention

The present invention relates to a chip-type piezoelectric-resonator, which is applied to a chip-type filter, oscillator, or discriminator, for example, and a method of manufacturing the same.

2. Description of the Background Art

In general, a piezoelectric-resonator which is applied to a filter, an oscillator or a discriminator is provided with lead wires.

In recent years, however, a surface mounting technique is employed in order to miniaturize an electronic device, leading to a requirement for a chip-type piezoelectric-resonator having no lead wires. A concrete example of such a chip-type piezoelectric-resonator is now described with reference to FIGS. 11 to 13.

As shown in FIGS. 11 to 13, a piezoelectric-resonator 1 comprises a piezoelectric substrate 2. Split vibrating electrodes 3 and 4 are formed on one major surface of the piezoelectric substrate 2, while still another vibrating electrode 5 is formed on another major surface of the substrate 2 to be opposite to the vibrating electrodes 3 and 4. These vibrating electrodes 3, 4 and 5 are respectively connected with terminal electrodes 6, 7 and 8, which are located on an edge of the piezoelectric substrate 2.

This piezoelectric-resonator 1 implements an energy trap type double mode piezoelectric-resonator utilizing a thickness vibration mode having the split vibrating electrodes 3 and 4 and the vibrating electrode 5 which is opposite thereto. Resin plates 11 and 12 of polyphenylene sulfide (PPS), having cavities 9 and 10 in portions corresponding to the vibrating electrodes 3 to 5 respectively, are arranged on both surfaces of the piezoelectric substrate 2, and fixed to the piezoelectric substrate 2 by adhesives 13 and 14. As shown in FIG. 13, external electrodes 15, 16 and 17 are formed on an outer surface of the piezoelectric-resonator 1, to be electrically connected with the terminal electrodes 6, 7 and 8 respectively.

Such a chip-type piezoelectric-resonator 1 is advantageously miniaturized, to enable surface mounting.

However, although the resin plates 11 and 12 are bonded to the piezoelectric substrate 2 by the adhesives 13 and 14, the adhesive strength is relatively weak and hence it is difficult to attain an effect of preventing undesired vibration in a portion other than a vibrating portion of the piezoelectric-resonator 1 for suppressing a spurious response.

Further, employment of the adhesives 13 and 14 may cause permeation of water through interfaces between the piezoelectric substrate 2 and the resin plate 11 and 12, leading to inferiority in moisture resistance.

In addition, it is difficult to align the vibrating electrodes 3 to 5 with the cavities 9 and 10 of the resin plates 11 and 12 since the resin plates 11 and 12 are bonded to the piezoelectric substrate 2 by the adhesives 13 and 14, leading to hindrance against automation.

The aforementioned cavities for vibrating spaces may alternatively be formed by a method of applying a cavity forming material such as wax, for example, to a vibrating region of the piezoelectric substrate and thereafter applying thermosetting protective resin so that the cavity forming material migrates into the protective resin when the protective resin is hardened. According to this method, however, it is difficult to attain high accuracy in relation to areas and shapes of portions which are supplied with the cavity forming material. If the cavity forming material is prepared from wax, further, the wax which is absorbed in the protective resin may be gasified when external electrodes are formed by sputtering or vacuum deposition under a high temperature condition, to hinder formation of the electrodes.

SUMMARY OF THE INVENTION

Accordingly, an object of the present invention is to provide a chip-type piezoelectric-resonator and a method of manufacturing the same, which can solve the aforementioned problems.

In order to solve the aforementioned technical problems, the chip-type piezoelectric-resonator according to the present invention has the following structure:

This chip-type piezoelectric-resonator comprises a piezoelectric resonance element including a piezoelectric substrate, vibrating electrodes which are opposite to each other through the piezoelectric substrate, and terminal electrodes which are connected with the vibrating electrodes respectively. In order to enclose a vibrating region of the piezoelectric resonance element, adhesive layers are provided in the form of banks on major surfaces of the piezoelectric resonance element respectively. Cover sheets are arranged on the respective adhesive layers, thereby defining cavities having thicknesses corresponding to those of the adhesive layers between the same and the vibrating region. Further, protective resin members are applied to cover both major surfaces of the piezoelectric substrate and the cover sheets.

In order to solve the aforementioned technical problems, the method of manufacturing a chip-type piezoelectric-resonator according to the present invention comprises the following steps:

First, prepared is a mother substrate comprising a piezoelectric substrate and a plurality of piezoelectric resonance elements, provided on the piezoelectric substrate, each including vibrating electrodes which are opposite to each other through the piezoelectric substrate and terminal electrodes which are connected with the vibrating electrodes respectively. Then, bank-shaped adhesive layers are formed on respective major surfaces of the mother substrate, to enclose respective vibrating regions of the piezoelectric resonance elements. On the other hand, also provided are mother sheets, each of which is provided with a plurality of cover sheets for covering spaces enclosed with the adhesive layers respectively. These mother sheets are arranged to cover the respective major surfaces of the mother substrate, so that the cover sheets are bonded to the respective adhesive layers. Thereafter thermosetting protective resin members are applied to cover both major surfaces of the mother substrate. Then, the mother substrate which is covered with the protective resin members is divided into independent piezoelectric resonance elements so that the terminal electrodes are exposed on divided surfaces, thereby obtaining a plurality of chip-type piezoelectric-resonators.

According to the inventive chip-type piezoelectric-resonator, cavities for vibrating spaces are defined by the adhesive layers and the cover sheets, whereby such cavities can be formed in correct shapes. Thus, it is possible to form the cavities homogeneously in height and reduce the cavities in height, thereby reducing the piezoelectric-resonator in height with no problem.

When the protective resin members are joined entirely along peripheral edges of both major surfaces of the piezoelectric substrate in the piezoelectric-resonator according to the present invention, high bond strength is attained between the protective resin members and the piezoelectric substrate, whereby it is possible to sufficiently suppress undesired vibration in a portion other than a vibrating portion of the piezoelectric-resonator. Further, it is possible to improve moisture resistance of the piezoelectric-resonator.

According to the inventive method of manufacturing a piezoelectric-resonator, on the other hand, the adhesive layers are formed in alignment with vibrating regions of the plurality of piezoelectric resonance elements which are provided by the mother substrate, the mother sheets are then arranged to cover respective major surfaces of the mother substrate so that the cover sheets are bonded to the adhesive layers, and the protective resin members are thereafter applied. Thus, the protective resin members are applied upon confirmation of proper alignment of the cavities and the vibrating regions, whereby it is possible to prevent manufacturing of a piezoelectric-resonator having cavities which are formed in improper positions.

According to the inventive manufacturing method, further, the mother substrate which is covered with the protective resin members is finally divided to obtain a plurality of chip-type piezoelectric-resonators, whereby it is possible to efficiently obtain a number of chip-type piezoelectric-resonators. As hereinabove described, the cavities are regularly formed reliably in proper states so that no parts of the cavities are exposed by division of the mother substrate, whereby it is possible to improve the manufacturing yield.

Further, it is possible to form the cavities with no employment of a cavity forming material such as wax. Thus, it is possible to advantageously solve the aforementioned problem which is brought by the cavity forming material, particularly wax. In other words, it is not necessary to consider such a problem that wax which lies concealed in the protective resin members is gasified to hinder formation of external electrodes, whereby the external electrodes can be formed by sputtering or vapor deposition under a high temperature condition with no problem. When the external electrodes are prepared from conductive paste, further, a temperature for baking the same is not restricted and hence it is possible to employ conductive paste which has excellent solderability but requires a high baking temperature with no problem.

In the manufacturing method according to the present invention, the mother sheet preferably has a plurality of cover sheets which are held by connecting portions having narrower widths than the cover sheets. Thus, it is possible to protect the protective resin members, which are applied to cover both major surfaces of the mother substrate, so that flows thereof are not much hindered by the connecting portions. In the as-obtained piezoelectric-resonator, therefore, it is possible to easily attain such a state that the protective resin members are joined entirely along peripheral edges of the major surfaces of the piezoelectric substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 9:
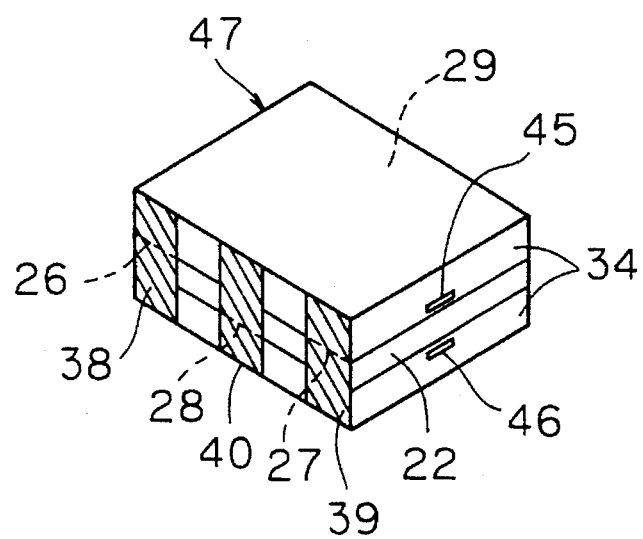
FIG. 9 is a perspective view showing the chip 47 appearing in FIG. 7, which is provided with external electrodes 38 to 40 on its side surface.
Figure 10:
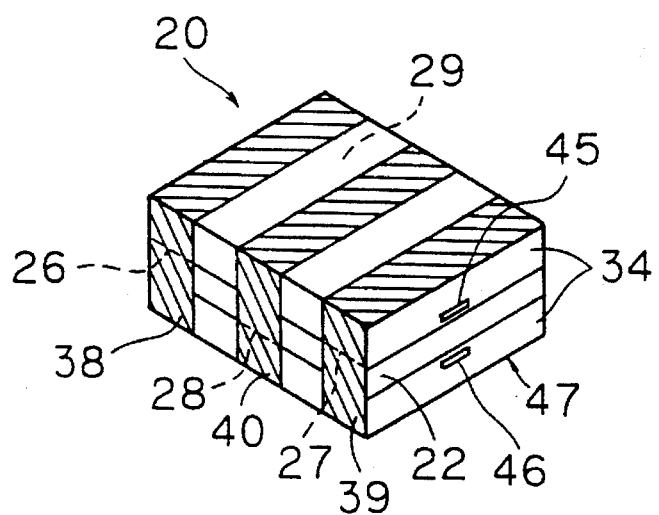
FIG. 10 is a perspective view showing the appearance of the chip-type piezoelectric-resonator 20 according to the embodiment of the present invention, which is obtained by spreading regions of the chip 47 shown in FIG. 9 provided with the external electrodes 38 to 40.
Figure 11:
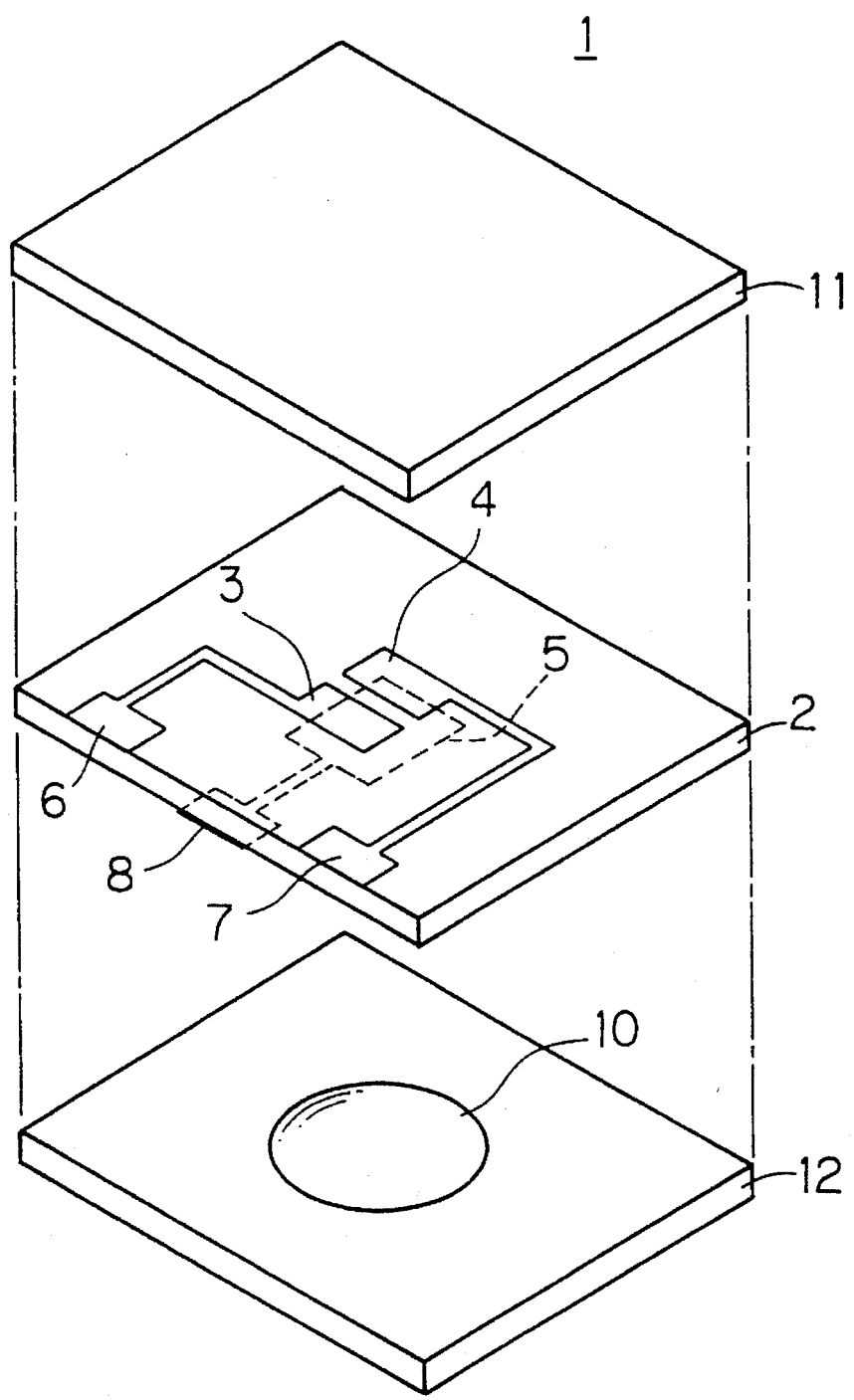
FIG. 11 is a perspective view showing elements included in a conventional chip-type piezoelectric-resonator 1 in an exploded manner.
Figure 12:
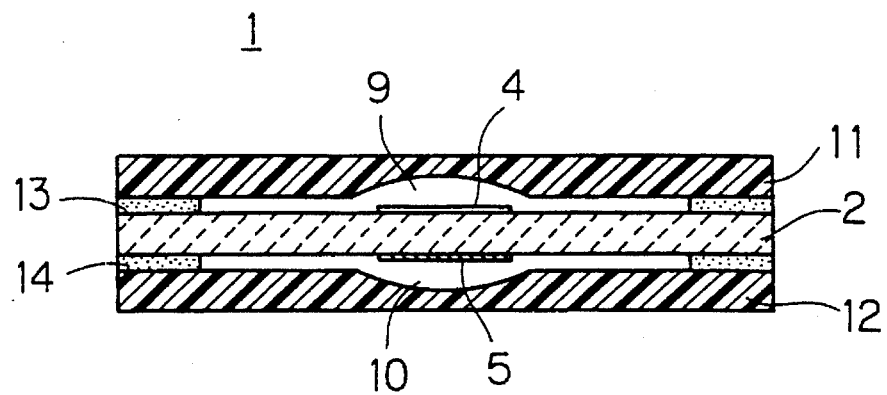
FIG. 12 is a sectional view of the chip-type piezoelectric-resonator 1 shown in FIG. 11.
Figure 13:
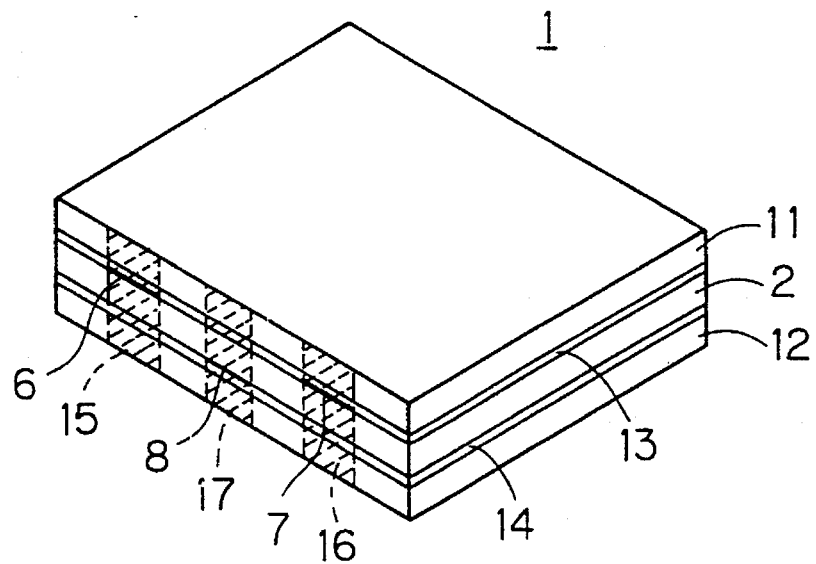
FIG. 13 is a perspective view showing the appearance of the chip-type piezoelectric-resonator 1 shown in FIG. 11.

FIG. 10 is a perspective view showing the appearance of a chip-type piezoelectric-resonator 20 according to an embodiment of the present invention. This piezoelectric-resonator 20 is obtained through steps shown in FIGS. 1 to 9 respectively.

Figure 1:
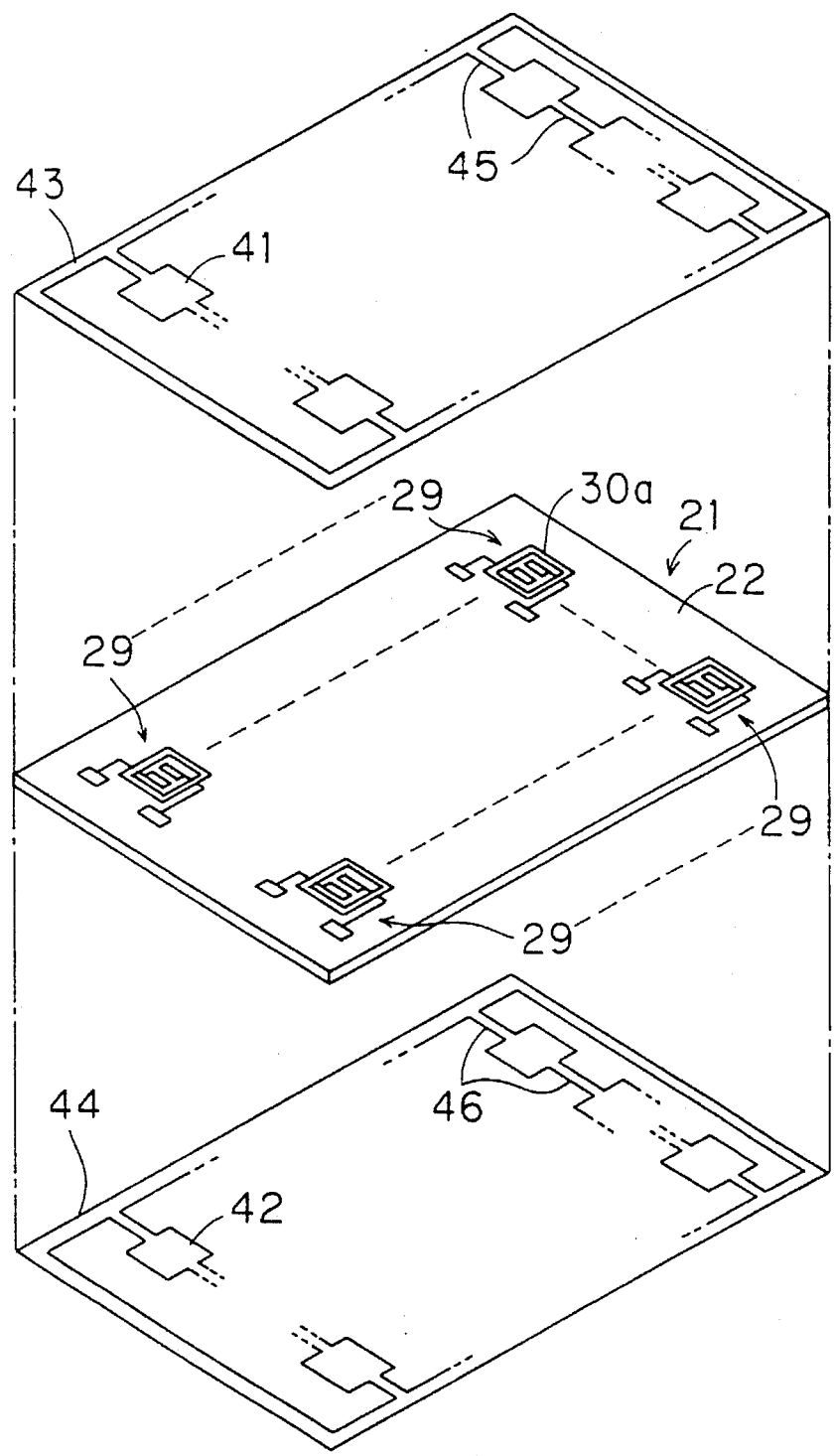
FIG. 1 is a perspective view showing a mother substrate 21 and mother sheets 43 and 44 which are prepared for obtaining a chip-type piezoelectric-resonator 20 according to an embodiment of the present invention in an exploded manner.
Figure 2:
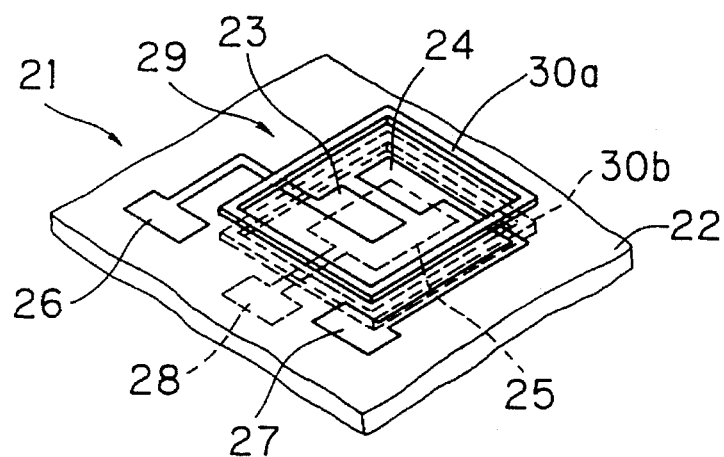
FIG. 2 is a perspective view showing a part of the mother substrate 21 shown in FIG. 1 in an enlarged manner.

First, a mother substrate 21 is prepared as shown in FIG. 1. FIG. 2 shows a part of this mother substrate 21 in an enlarged manner. This mother substrate 21 comprises a piezoelectric substrate 22 of a piezoelectric ceramic material, which is provided with split vibrating electrodes 23 and 24 formed on one major surface thereof and still another vibrating electrode 25 formed on another major surface to be opposite to the vibrating electrodes 23 and 24. Terminal electrodes 26, 27 and 28 are connected to the vibrating electrodes 23, 24 and 25 respectively. Each combination of the vibrating electrodes 23 to 25 and the terminal electrodes 26 and 28 defines a single piezoelectric resonance element 29, so that the mother substrate 21 provides a plurality of such piezoelectric resonance elements 29.

Each piezoelectric resonance element 29 implements an energy trap double mode piezoelectric-resonator utilizing a thickness vibration mode, which has the split vibrating electrodes 23 and 24 and the vibrating electrode 25 being opposite thereto. In order to ensure vibrating spaces, the following proceedings are employed:

First, bank-shaped adhesive layers 30a and 30b are formed on respective major surfaces of the mother substrate 21 by printing, for example, to enclose respective vibrating regions of the piezoelectric resonance elements 29.

On the other hand, also prepared are mother sheets 43 and 44, which are provided with plural cover sheets 41 and 42 for covering spaces enclosed with the adhesive layers 30a and 30b respectively. These mother sheets 43 and 44, preferably having electrical insulativity, are formed by papers or thin resin sheets, for example. In such mother sheets 43 and 44, the plural cover sheets 41 and 42 are preferably held by connecting portions 45 and 46 having narrower widths than the cover sheets 41 and 42. Further, the mother sheets 43 and 44 preferably have the same outside dimensions as the mother substrate 21.

The aforementioned mother sheets 43 and 44 are arranged to cover the respective major surfaces of the mother substrate 21, so that the cover sheets 41 and 42 are bonded to the adhesive layers 30a and 30b. When the mother sheets 43 and 44 have the same outside dimensions as the mother substrate 21 as described above, these mother sheets 43 and 44 can be easily registered with the mother substrate 21.

Figure 3:
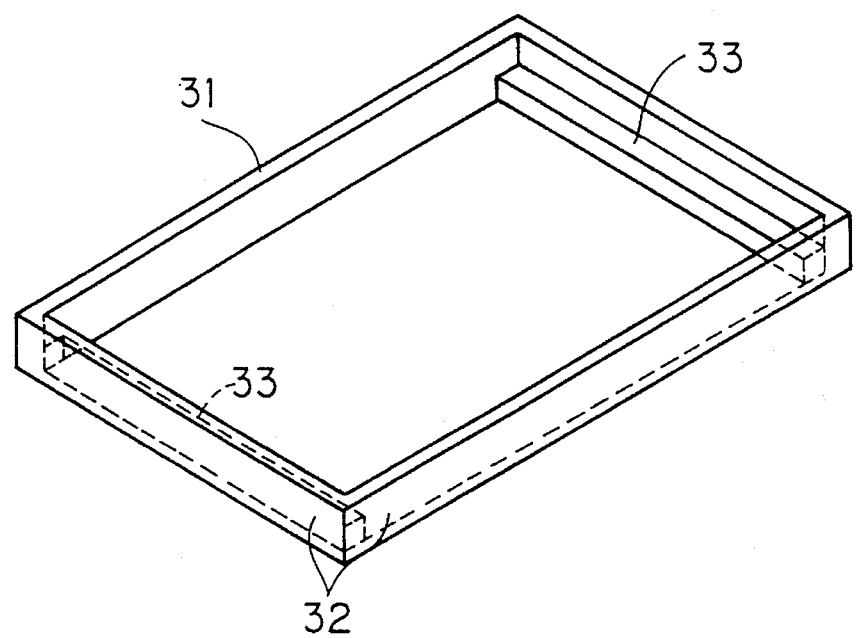
FIG. 3 is a perspective view showing a frame 31 which is employed for obtaining the chip-type piezoelectric-resonator 20 shown in FIG. 1.

On the other hand, a frame 31 of resin, for example, is so prepared that the aforementioned mother substrate 21 can be substantially tightly fitted thereinto, as shown in FIG. 3. This frame 31 is so prepared that the same is neither deformed nor melted by a temperature of about 150° C., for example, for heating and hardening protective resin as described later. Outer side surfaces 32 of this frame 31 are preferably improved in flatness, if the same are used as reference planes in cutting as described later.

Further, the frame 31 is preferably provided with means capable of fixing the as-received mother substrate 21 substantially at a central portion along the direction of its thickness. According to this embodiment, shelves 33 are provided on opposite edges, such as shorter edges, for example, of the frame 31 respectively.

Figure 4:
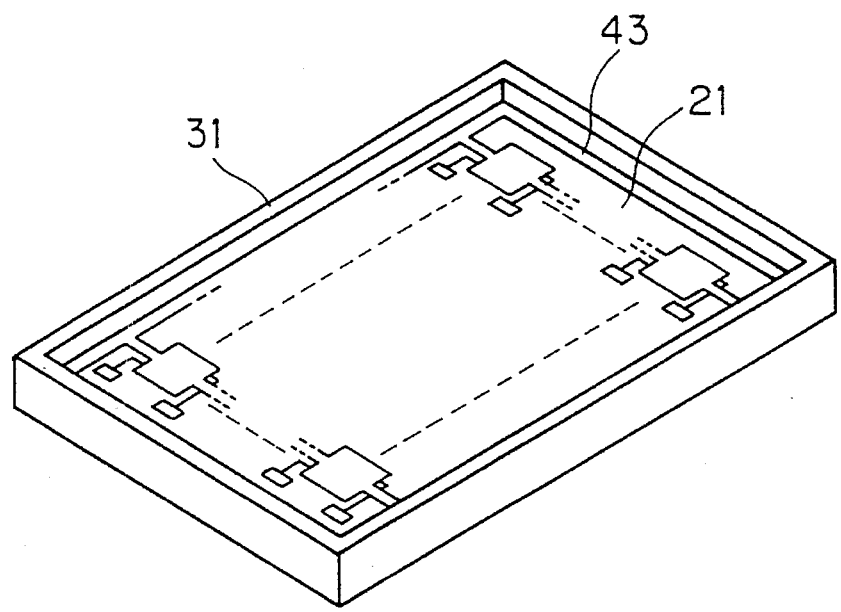
FIG. 4 is a perspective view showing the mother substrate 21 and the mother sheets 43 and 44, shown in FIG. 1, which are fitted into the frame 31 appearing in FIG. 3.
Figure 5:
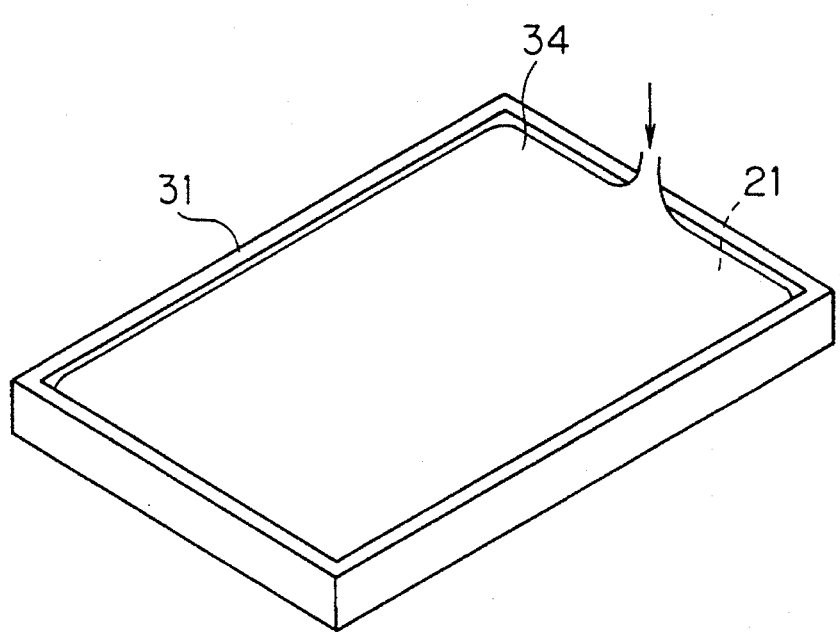
FIG. 5 is a perspective view showing a state in which protective resin 34 is introduced onto the mother substrate 21 shown in FIG. 4.

The mother substrate 21 which is covered with the aforementioned mother sheets 43 and 44 is fitted into the frame 31 as shown in FIG. 4, and unhardened protective resin 34 is introduced onto one surface of the mother substrate 21 in this state, as shown in FIG. 5. This protective resin 34 is prepared from epoxy-system thermosetting resin which is liquefied with a solvent, for example. The protective resin 34 is dried at room temperature, for example, not to flow out upon reversal of the frame 31 with the mother substrate 21, and thereafter the frame 31 is reversed with the mother substrate 21 and the protective resin 34 so that another protective resin 34 is introduced onto the other surface of the mother substrate 21. This protective resin 34 is also dried at room temperature, for example.

It is not requisite to insert the mother sheets 43 and 44 and the mother substrate 21 in the frame 31 in already superposed states as described above, but the frame 31 may alternatively be employed as a guide member for registering these elements with each other, to successively receive either mother sheet 43 or 44, the mother substrate 21, and the other mother sheet 44 or 43.

Then, the protective resin members 34 which are introduced in two stages as described above are heated and hardened at 150° C. for 30 minutes, for example. As hereinabove described, the cover sheets 41 and 42 are held by the relatively thin connecting portions 45 and 46 which hardly block flows of the protective resin members 34, whereby the protective resin members 34 can be sufficiently introduced into clearances between the connecting portions 45 and 46 and the mother substrate 21.

Then, outer surfaces of the respective protective resin members 34 are polished with the frame 31, in order to improve each chip-type piezoelectric-resonator 20 (see FIG. 10) to be obtained in dimensional accuracy along the thickness direction and flatness. Such polishing is carried out by lapping with a polishing plate, for example. Thus obtained is a sandwich structure 35 of the mother substrate 21 and the protective resin members 34 covering both surfaces thereof, as shown in FIG. 6.

Figure 6:
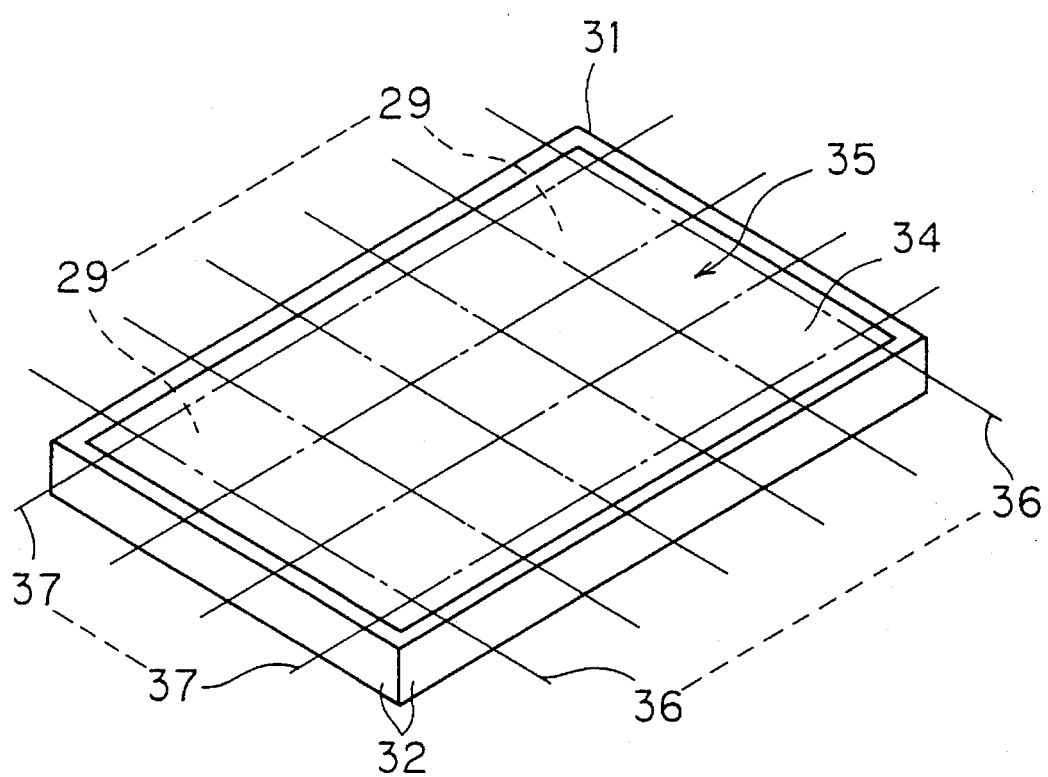
FIG. 6 is a perspective view for illustrating a step of cutting a sandwich structure 35 which is obtained after hardening the protective resin 34 shown in FIG. 5.

Then, this sandwich structure 35 is cut with the frame 31 along cutting lines 36 and 37 through reference planes defined by the outer side surfaces 32 of the frame 31, as shown in FIG. 6. Thus, the mother substrate 21 is divided into individual piezoelectric resonance elements 29, so that the terminal electrodes 26 to 28 are exposed on the cut surfaces. Thus obtained is a chip 47 shown in FIGS. 7 and 8.

Figure 7:
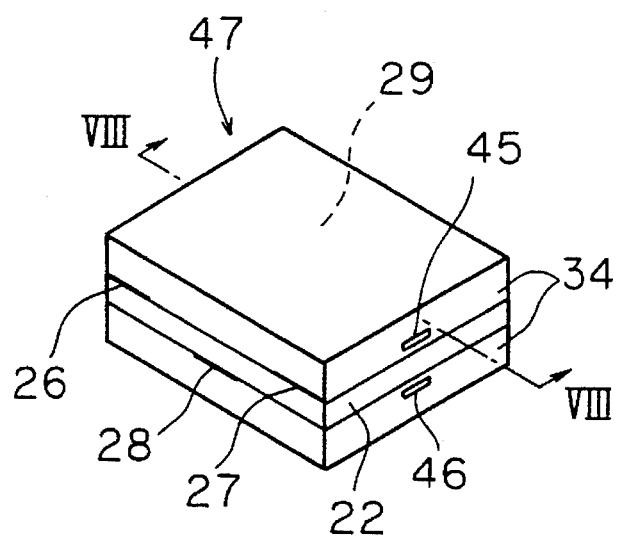
FIG. 7 is a perspective view showing a chip 47 which is obtained through the cutting step shown in FIG. 6.
Figure 8:
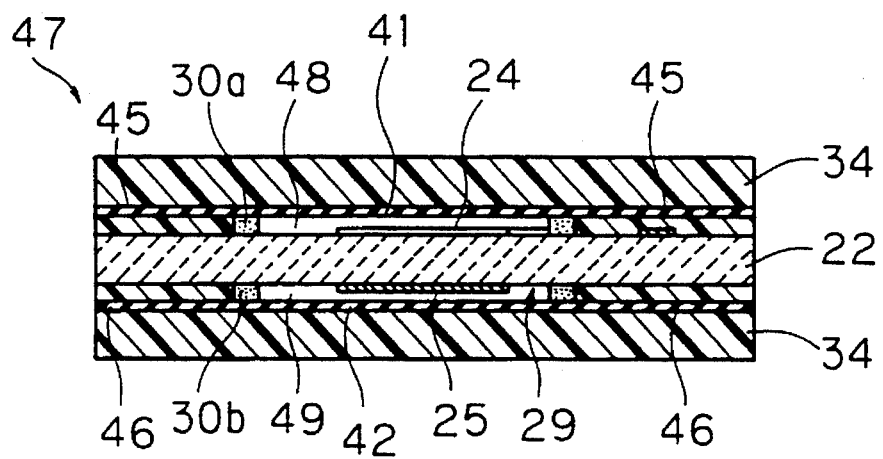
FIG. 8 is a sectional view taken along the line VIII—VIII in FIG. 7.

As shown in FIG. 7, sections of the connecting portions 45 and 46 appear on a prescribed end surface of the chip 47. When the colors of such connecting portions 45 and 46, i.e., the colors of the mother sheets 43 and 44 are identical to those of the protective resin members 34, it is possible to prevent the sections of the connecting portions 45 and 46 from attracting attention on the outer surface of the chip 47. As shown in FIG. 8, further, the cover sheets 41 and 42 are arranged on the adhesive layers 30a and 30b respectively, thereby defining cavities 48 and 49 having thicknesses corresponding to those of the adhesive layers 30a and 30b in relation to a vibrating region of the piezoelectric resonance element 29.

The aforementioned polishing and cutting step may be carried out after the sandwich structure 35 is taken out from the frame 31.

Then, external electrodes 38 to 40 are applied to at least the surface of the chip 47 exposing the terminal electrodes 26 to 28 by printing and baking of conductive paste, for example, to conduct with the terminal electrodes 26 to 28 respectively, as shown in FIG. 9.

While all terminal electrodes 26 to 28 are exposed on the same surface according to this embodiment, such terminal electrodes may be exposed on separate surfaces. In this case, external electrodes may be applied to the respective ones of such surfaces.

While the chip 47 may be applied to a chip-type piezoelectric-resonator in the state shown in FIG. 9, the external electrodes 38, 39 and 40 provided on one side surface of the chip 47 are preferably further extended toward at least one of the upper and lower surfaces of the chip 47, and further to the other side surface. Thus, it is possible to reliably solder the chip-type piezoelectric-resonator 20, in order to mount the same on a circuit board. Portions of the external electrodes 38 to 40 which are formed on the upper and/or lower surface of the chip-type piezoelectric-resonator 20 may be previously provided in the state of the sandwich structure 35 shown in FIG. 6 by a method such as printing and baking of conductive paste.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A chip-type piezoelectric-resonator comprising:
    a piezoelectric resonance element including a piezoelectric substrate, vibrating electrodes that are opposite to each other through said piezoelectric substrate, and terminal electrodes that are connected with said vibrating electrodes, respectively;
    peripheral walls of adhesive layers provided on respective major surfaces of said piezoelectric substrate so as to enclose a vibrating region of said piezoelectric resonance element;
    cover sheets having outer and inner major surfaces, said inner major surfaces being arranged on respective said adhesive layers for defining cavities between the cover sheets and said vibrating region, each said cavity having a periphery and a thickness corresponding to a thickness of said respective adhesive layers thereby providing spaces for vibration of said vibrating region; and
    protective resin members in contact with and extending into a space defined between said cover sheets and said major surfaces of said piezoelectric substrate outside said adhesive layers and along the entire periphery of each said cavity, said protective resin members thereby sealing said cavities.

2. A chip-type piezoelectric-resonator in accordance with claim 1, wherein said cover sheets are made of an electrical insulating material.

3. A chip-type piezoelectric-resonator in accordance with claim 1 wherein said piezoelectric-resonator is generally parallelepiped in shape with a top surface, an opposing bottom surface and two pairs of opposing side surfaces, one opposing side surfaces being longer than the other pair of opposing pair of side surfaces, said terminal electrodes extending to at least one of said longer side surfaces, said piezoelectric-resonator further comprising:
    external electrodes on at least said one longer side surface contacting said terminal electrodes.

4. A chip-type piezoelectric-resonator in accordance with claim 3, wherein said external electrodes are also on at least one of said top and bottom surfaces, and on said other longer side surface.

5. A chip-type piezoelectric-resonator in accordance with claim 1, wherein said vibrating electrodes are located spaced inwardly from a periphery of said piezoelectric substrate.

6. A chip-type piezoelectric-resonator in accordance with claim 5, wherein said peripheral walls of adhesive layers extend continuously around said vibrating electrodes.

7. A chip-type piezoelectric-resonator in accordance with claim 6, wherein said peripheral walls of adhesive layers are spaced inwardly from said periphery of said piezoelectric substrate.

8. A chip-type piezoelectric-resonator in accordance with claim 1, wherein said peripheral walls of adhesive layers are spaced inwardly from a periphery of said piezoelectric substrate.

9. A chip-type piezoelectric-resonator in accordance with claim 1, wherein said peripheral walls of adhesive layers extend continuously around said vibrating electrodes.

10. A chip-type piezoelectric-resonator in accordance with claim 9, wherein said peripheral walls of adhesive layers are spaced inwardly from said periphery of said piezoelectric substrate.

11. A chip-type piezoelectric-resonator in accordance with claim 1, wherein said resin members extend continuously around a periphery of said piezoelectric substrate.

12. A chip-type piezoelectric-resonator in accordance with claim 11, wherein said resin members extend continuously around said space defined between said cover sheets and said piezoelectric substrate.

13. A chip-type piezoelectric-resonator in accordance with claim 12, wherein said resin members extend continuously around said space defined between said periphery of said piezoelectric substrate and said peripheral walls of adhesive layers.

14. A chip-type piezoelectric-resonator in accordance with claim 1, wherein said resin members extend continuously around said space defined between said cover sheets and said piezoelectric substrate.

15. A chip-type piezoelectric-resonator in accordance with claim 14, wherein said resin members extend continuously around said space defined between said periphery of said piezoelectric substrate and said peripheral walls of adhesive layers.

16. A chip-type piezoelectric-resonator in accordance with claim 1, wherein said resin members extend continuously around said space defined between said periphery of said piezoelectric substrate and said peripheral walls of adhesive layers.

17. A chip-type piezoelectric-resonator in accordance with claim 1, wherein said protective resin members cover said outer major surfaces of said cover sheets.

* * * * *